United States Patent
James

(10) Patent No.: US 7,024,937 B2
(45) Date of Patent: Apr. 11, 2006

(54) ISOLATED PRESSURE TRANSDUCER

(75) Inventor: Thomas James, Macomb Township, MI (US)

(73) Assignee: Honeywell International Inc., Morristown, NJ (US)

( * ) Notice: Subject to any disclaimer, the term of this patent is extended or adjusted under 35 U.S.C. 154(b) by 86 days.

(21) Appl. No.: 10/725,944

(22) Filed: Dec. 3, 2003

(65) Prior Publication Data
US 2005/0120798 A1 Jun. 9, 2005

(51) Int. Cl.
G01L 7/00 (2006.01)

(52) U.S. Cl. .......................................... 73/756
(58) Field of Classification Search ................ 73/715, 73/700, 706, 708, 719, 720, 721, 723, 727, 73/753, 756
See application file for complete search history.

(56) References Cited

U.S. PATENT DOCUMENTS

| 4,317,372 | A | * | 3/1982 | Hartemann | 73/703 |
| 4,416,156 | A | | 11/1983 | Demark et al. | |
| 5,125,275 | A | | 6/1992 | Wilda et al. | |
| 5,257,547 | A | | 11/1993 | Boyer | |
| 5,329,819 | A | * | 7/1994 | Park et al. | 73/724 |
| 5,676,132 | A | * | 10/1997 | Tillotson et al. | 128/204.23 |
| 5,756,899 | A | | 5/1998 | Ugai et al. | |
| 6,021,674 | A | | 2/2000 | Roethlingshoefer et al. | |
| 6,169,316 | B1 | * | 1/2001 | Sakai et al. | 257/419 |
| 6,227,055 | B1 | | 5/2001 | Pitzer | |
| 6,550,337 | B1 | * | 4/2003 | Wagner et al. | 73/715 |
| 2003/0196493 | A1 | | 10/2003 | Mallison et al. | |

FOREIGN PATENT DOCUMENTS

EP   0322122    6/1989
JP   01272304   10/1989

OTHER PUBLICATIONS

PCT-Notification of Transmittal of the International Search Report and the Written Opinion of the International Searching Authority, or the Declaration, Date Mailed May 9, 2005.

* cited by examiner

Primary Examiner—Max Noori
(74) Attorney, Agent, or Firm—Kermit D. Lopez; Luis M. Ortiz

(57) ABSTRACT

A pressure transducer includes a carrier having a central aperture for receiving fluid from a vessel. A sense die mounts on the carrier having a first side configured to interact with a fluid from the vessel. A gel attaches the sense die to the carrier. Pressure-sensing circuitry is formed on a second side of the sense die not exposed to the fluid. Further, a ceramic board mounts on the carrier, the ceramic board has conductive paths electrically connecting the pressure-sensing circuitry. Circuitry other than the pressure-sensing circuitry also mounts on the ceramic board and is electrically connected to the conduction paths. A hermetically-sealed cover configured to prevent the fluid or other external elements from contacting the second side of the sense die wherein the cover creates a defined volume surrounding the second side.

9 Claims, 6 Drawing Sheets

ISOLATED PRESSURE TRANSDUCER

FIELD OF THE DISCLOSURE

This disclosure relates generally to a pressure transducer, and in particular, a pressure transducer having a piezoresistive sensing die incorporated therein.

BACKGROUND OF INVENTION

Piezoresistive based sensors, or sense die, may be used to measure the pressure in many applications, including manifold absolute pressure (MAP) applications, exhaust gas recirculation (EGR) systems, low pressure fuel measurement applications, and the like. Typically, in these applications, fluid interacts and measurements are taken from the side of the sense die having pressure-sensing circuitry and wire connections. FIG. 11 illustrates an example of a sense die 100 implemented in the prior art. As depicted, resistors 101 are implanted in a piezoresistive silicon substrate 102. Metal contacts 104 are also implanted in the substrate 102 and separately connected to each end of the resistors 101. A diaphragm 106 is disposed over the substrate 102 and resistors 101. When a fluid or other medium invokes a force in the direction 108 illustrated, the diaphragm 106 flexes, which alters the crystal structure of the substrate 102 and is detected by resistors 101. Wires 110 connected to metal contacts 104 transmit signals corresponding to the detected force.

In order to protect the sense die 100 from degrading effects of fluids, a gel (not shown) is applied to cover the surface of the sense die 100 and wiring 110, metal contacts 104, diaphragm 106, etc. The wires 110 and metal contacts 104 typically include an increased amount of gold or the gold is replaced entirely with platinum. These measures protect the sense die 100, wires 110, and contacts 104 from degradation over time. However, problems become apparent when the pressure medium contains corrosive elements. The corrosive elements tend to infiltrate into the gel, aggressively corroding the wiring, bonds, metal contacts 104, and the sensing die 100.

Conventional techniques for securing the sense die 100 to a medium require a detailed process of forming a glass on the underside of the substrate 102. The glass attachment technique firmly secures the sense die 100, and the integrity of the attachment remains consistent over a wide pressure range. However, the glass attachment to the silicon sensing element unnecessarily increases cost and manufacturing time due to the complexity, which is undesired in pressure-sensing applications that do not operate in the full operating range of a glass attachment. Accordingly, a need exists for a less complex and less costly attachment technique, while protecting the circuitry associated with the sensing die from the pressure medium as well as outside environments.

SUMMARY

These and other needs are met by certain embodiments of the disclosure, which provide a pressure transducer comprising a carrier having a central aperture receiving fluid from a vessel. A sense die is mounted on the carrier, the sense die having a first side positioned to interact with a fluid from the vessel. Pressure-sensing circuitry is formed on the second side of the sense die. In certain embodiments, a gel forms a bond between the first side and the carrier for attaching the sense die to the carrier.

According to other aspects of the disclosure, a pressure transducer comprises a carrier having a central aperture for receiving fluid from a vessel. A sense die mounts on the carrier having a first side positioned to interact with the fluid received from the vessel. Pressure-sensing circuitry is formed on a second side of the sense die. A hermetically-sealed cover is positioned to prevent the fluid or other external elements from contacting at least the second side of the sense die.

In still other aspects, a pressure transducer is provided comprising a carrier having a central aperture for receiving fluid from a vessel. A sense die is mounted on the carrier, the sense die having a first side positioned to interact with the fluid received from the vessel. Pressure-sensing circuitry is formed on the second side of the sense die. A ceramic board is mounted on the carrier, the ceramic board has conductive paths electrically connecting the pressure-sensing circuitry to external circuitry.

According to further aspects, a pressure transducer comprises a carrier having a central aperture for receiving fluid from a vessel. A sense die mounts on the carrier having a first side positioned to interact with the fluid received from the vessel. A gel attaches the sense die to the carrier. Pressure-sensing circuitry is formed on a second side of the sense die. Further, a ceramic board mounts on the carrier, the ceramic board has conductive paths electrically connecting the pressure-sensing circuitry. Associated circuitry other than the pressure-sensing circuitry also mounts on the ceramic board and is electrically connected to the conduction paths. A hermetically-sealed cover prevents the fluid or other external elements from contacting at least the second side of the sense die.

The foregoing and other features, aspects, and advantages of the present invention will become more apparent from the following detailed description of the present invention when taken in conjunction with the accompanying drawings.

DETAILED DESCRIPTION OF THE INVENTION

Figure 1:
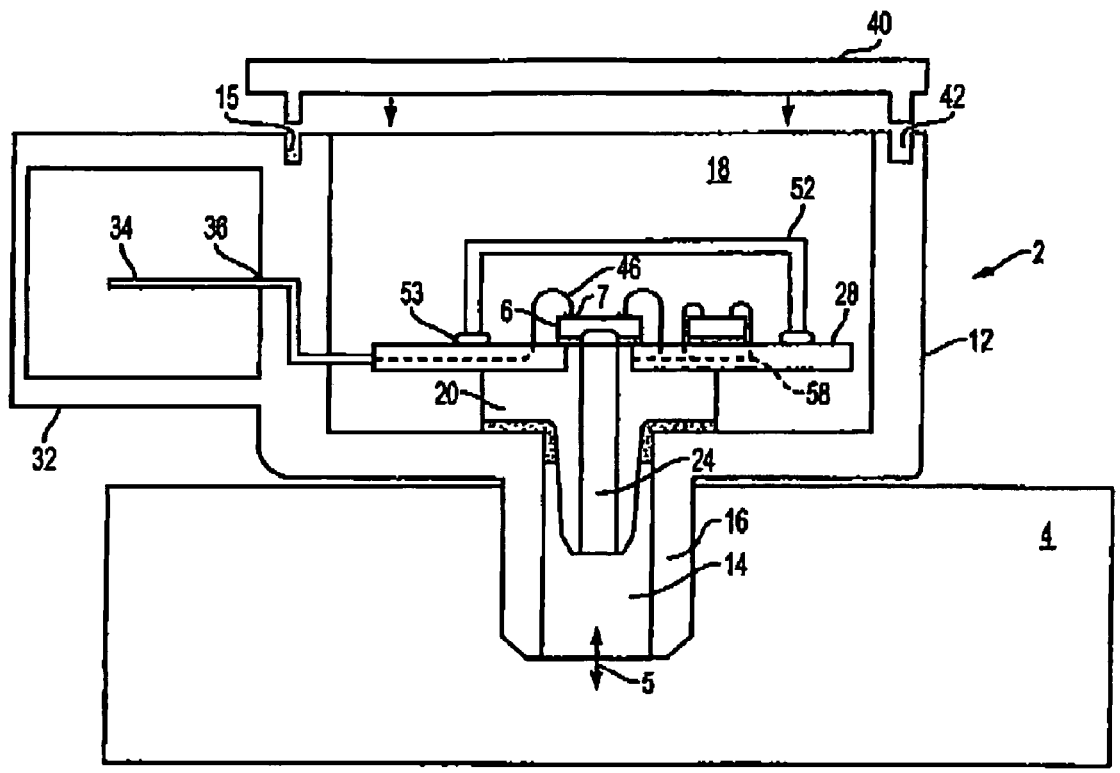
FIG. 1 is a cross-sectional view of the pressure transducer and containment.

FIG. 1 is a cross-sectional view of a pressure transducer 2 and containment of the same. The pressure transducer 2 senses pressure of fluid contained in vessel 4 using a piezoresistive sensing die (sensing die) 6. The vessel 4 may be a pipe in which fluid flows, a vessel containing fluid, or any other type of fluid containment. Further, the fluid may be in liquid, gaseous, or other state. The pressure transducer 2 measures fluid pressure by sensing the force acting on sense die 6.

Conventionally, pressure is sensed from the side of a sensing die maintaining resistor circuitry and metal contacts. However, in the illustrated arrangement, the pressure of the fluid acts on a first side 10 of the sensing die 6, i.e., the side opposite that of the resistors (not shown) and metal contacts 7. The resistors and metal contacts 7 need not be formed on a side opposite the first side, but rather on a side not exposed to the fluid from the vessel. Specifically, fluid flows from vessel 4 through housing aperture 14 and carrier aperture 24, as indicated by flow arrow 5, to the first side 10 of sensing die 6. Changes in pressure cause a change in the crystal structure of sensing die 6, which is detected and processed by associated circuitry to determine the pressure of the fluid contained in vessel 4. The associated circuitry commonly includes an ASIC 57, resistors and metal contacts 7, wiring 46, conduction paths 58, and the like described in detail below.

The resistive circuitry and metal contacts 7 located on the second side 8 of the sensing die 6 are isolated from any interaction with fluid. Degradation is minimized and efficiency is increased by such an arrangement, as fluid contact to the second side 8 would tend to degrade the sensing die 6.

Housing 12 includes a housing containment area 18 for sensing die 6 and associated circuitry. Housing 12 also includes housing aperture 14 extending through a neck portion 16. Housing 12 mounts to vessel 4 with the neck 16 extending into vessel 4, thereby fluidly coupling housing 12 to vessel 4. As a result, fluid may enter the housing neck 16 through housing aperture 14. It is not desirable, however, for fluid to enter the housing containment area 18 and interact with associated circuitry.

Figure 2:
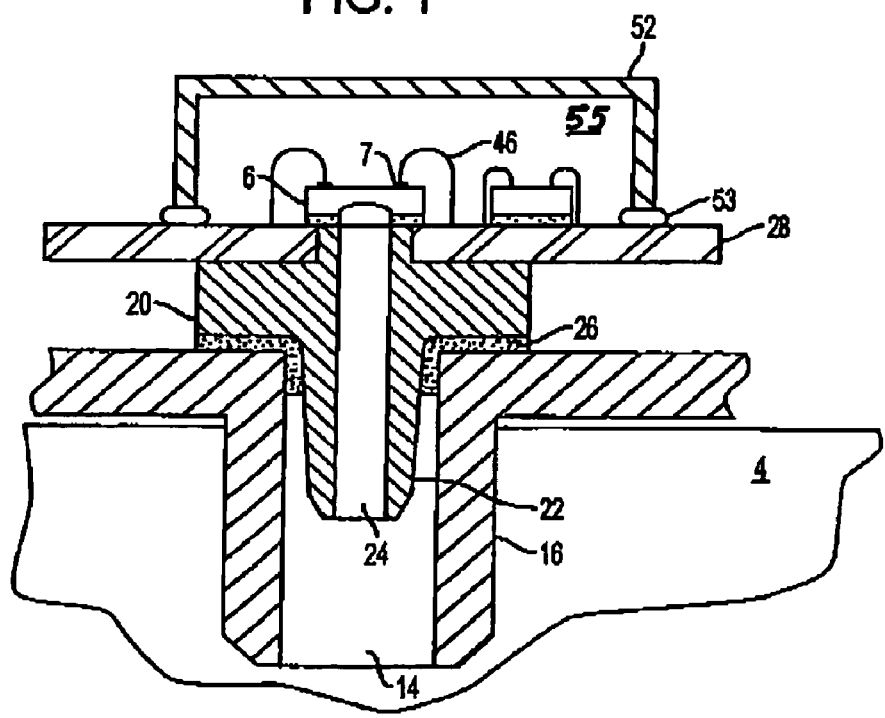
FIG. 2 is an enlarged cross-sectional view of the pressure transducer denoted in FIG. 1.

FIG. 2 illustrates an enlarged view of the carrier 20, which is arranged to restrict or confine the fluid flow to interact only with the first side 10 of sensing die 6 and prevents fluid from entering the housing containment area 18. Carrier 20 has a neck portion 22 that includes the central aperture 24. The outer dimension of the carrier neck 22 is slightly smaller than the inner dimension of the housing aperture 14 of the housing neck 16. The carrier 20 is contained by the housing 12 with the carrier neck 22 extending into the housing neck 16. This arrangement restricts fluid flow from vessel 4 to housing aperture 14 and carrier aperture 24. In order to securely mount carrier 20 to housing 12, a gel or epoxy 26 is applied to the area where the housing 12 and the carrier 20 interact. Once applied, the gel or epoxy 26 is cured to permanently attach and seal the carrier 20 to the housing 12. The cured gel 26 further prevents the fluid from entering the containment area 18. Advantageously, fluid from the pressure medium 4 only flows through the carrier aperture 24 and does not enter the housing containment area 18, which would affect the second side 8 of the sense die 6 and associated circuitry.

Figure 3:
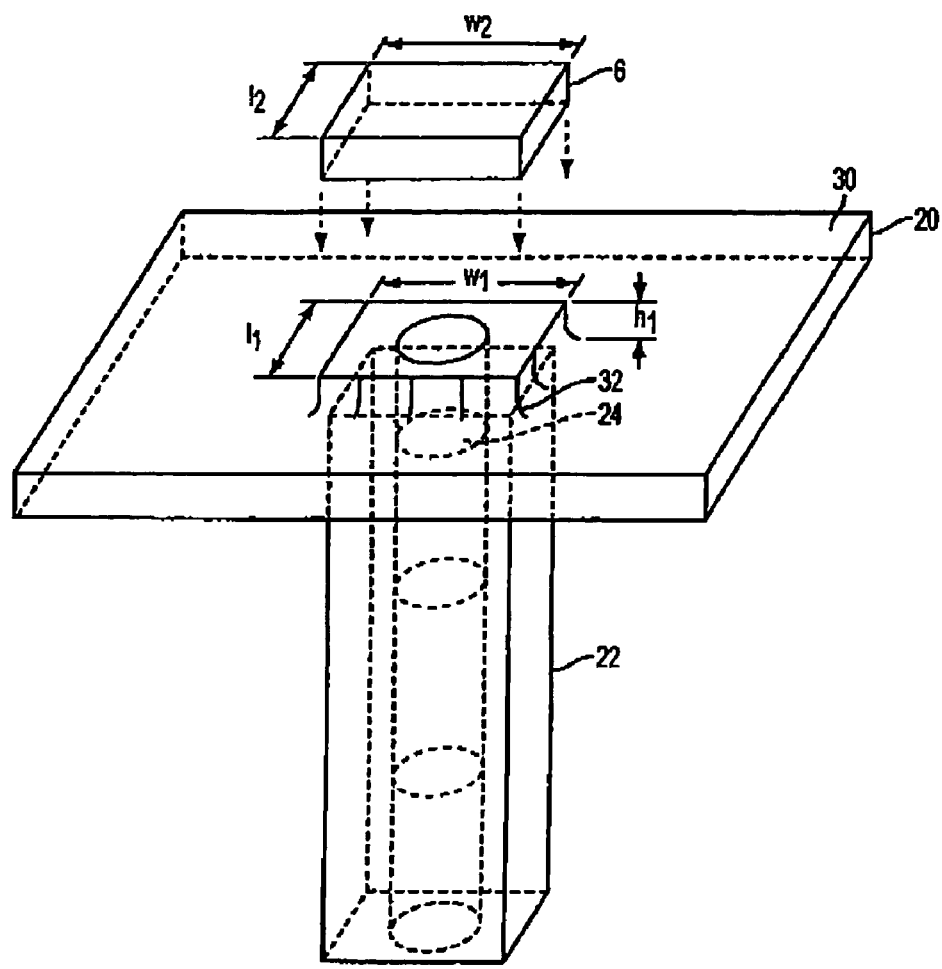
FIG. 3 is an oblique view of the carrier and piezoresistive sensing die.
Figure 4:
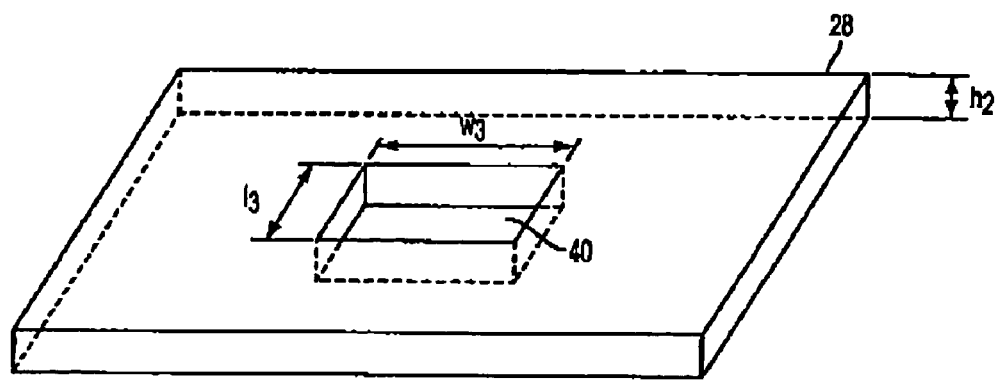
FIG. 4 is an oblique view of the ceramic board.
Figure 5:
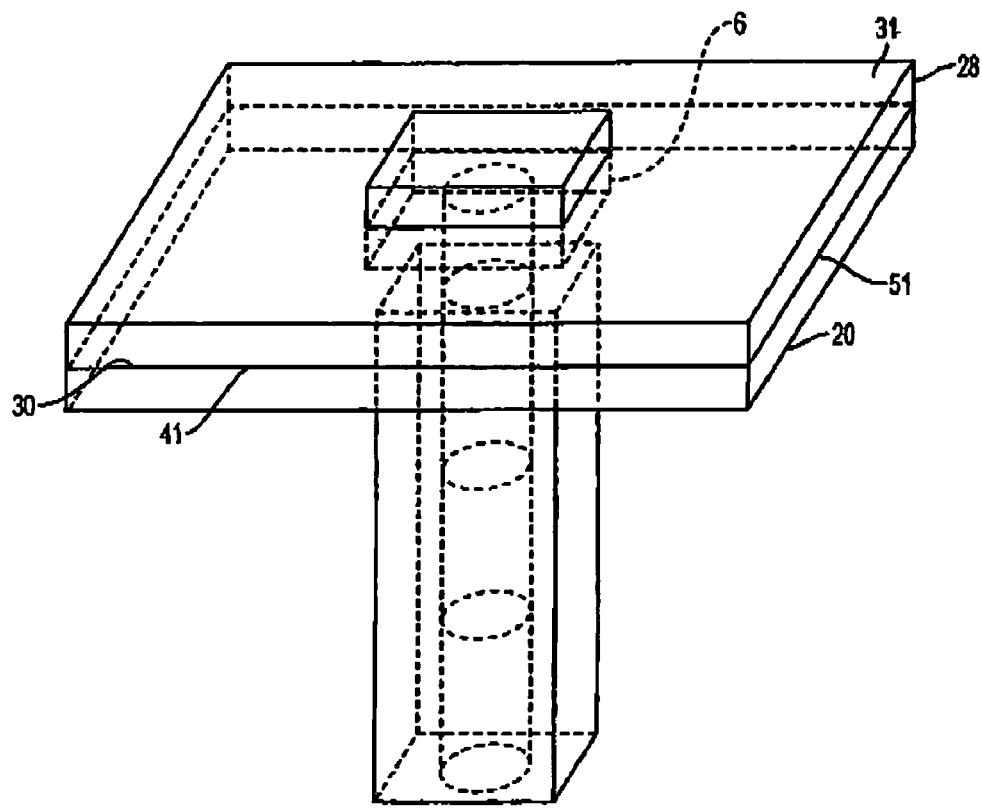
FIG. 5 is an oblique view of the ceramic board and sensing die mounted on the carrier.

The carrier 20 supports the sensing die 6 and a ceramic board 28, which maintains the associated circuitry. FIG. 3 is an oblique view of the carrier 20 and placement of the sense die 6 thereon. FIG. 4 is an oblique view of the ceramic board 28. FIG. 5 is an oblique view of the ceramic board 28 and sense die 6 arranged on the carrier 20. Adverting to FIG. 3, the carrier 20 has a planar surface 30 orthogonal to the carrier neck 22, the planar surface 30 supporting the ceramic board 28. A raised surface 32 in the center of the planar surface 30 coinciding with the carrier aperture 24 supports the sensing die 6. In other words, the carrier aperture 24 extends through the carrier neck 22 to an opening at the raised surface 32 where the sensing die 6 mounts. In the illustrated exemplary embodiment, the raised surface 32 has perimeter dimensions $l_1$ and $w_1$ corresponding to the perimeter dimensions $l_2$ and $w_2$ of sensing die 6. Further, the height $h_1$ of raised surface 32 may be substantially equal to the thickness $h_2$ of the ceramic board 28, as illustrated by FIG. 4.

The ceramic board 28 has an aperture 40 extending therethrough with perimeter dimensions $l_3$, $w_3$ and $h_3$ corresponding to the perimeter dimensions $l_1$, $w_1$ and $h_1$ of the raised surface 32. Therefore, when ceramic board 28 is mounted to the carrier 20 as illustrated in FIG. 5, a substantially planar surface 31 is formed by ceramic board 28 and the raised surface 32 of the carrier 20. Advantageously, the ceramic board 28 can be easily replaced without disturbing the bond between sensing die 6 and the carrier 20 described below. Further, a gel or epoxy 41 may be applied and cured to attach the ceramic board 28 to the planar surface 30.

Figure 6:
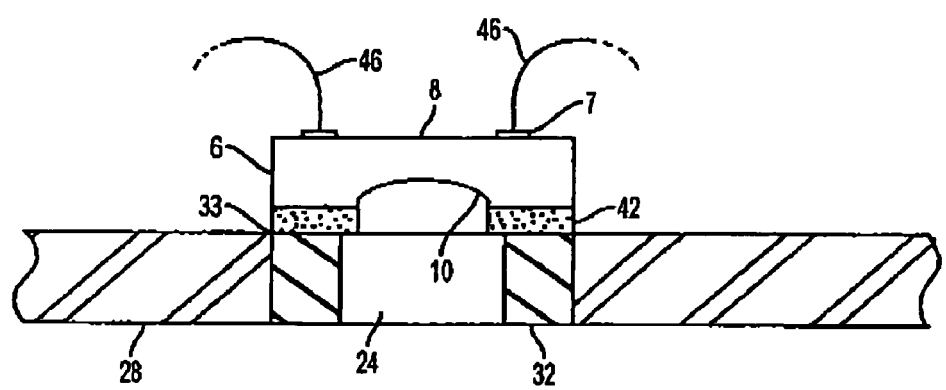
FIG. 6 is a cross-sectional view of the piezoresistive sensing die and cap mounted on the carrier as denoted in FIGS. 1 and 2.

The pressure transducer 2 provides for a novel attachment of the sensing die 6 to the carrier 20. In conventional techniques, the methods of forming a glass on the first side 10 of the sensing die 6 employ a detailed attachment process. The pressure transducer 2 described herein replaces the conventional glass attachment, which significantly reduces the complexity of the attachment process as well as reduces manufacturing costs. A gel 42 is used to bond the sensing die 6 to the carrier 20. The gel 42 attachment is best illustrated by FIG. 6. As depicted, gel 42 forms a bond between the carrier 20, and more particularly the raised surface 32, and the first side 10 of the sense die 6. Gel 42 is applied to the first side 10 of sensing die 6, and sensing die 6 and gel 42 are then placed on raised surface 32 of carrier 20 covering carrier aperture 24. The first side 10 of sensing die 6 covers a larger surface area than is occupied by carrier aperture 24, which provides for an attachment area 33 on the peripheral surface of carrier aperture 24 on raised surface 32. The gel 42 is cured in order to permanently attach sensing die 6 to carrier 20. The gel or epoxy 24 attaching carrier 20 to housing 12 and the gel 41 attaching ceramic board 28 to carrier 20 may be the same gel 42 used in the attachment of the sensing die 6. However, other attachment measures known to those skilled in the art may be utilized.

Gel 42 is available from National Starch under the trademark TRA-BOND. Adhesion is best between a temperature range from −40 to 150 degrees Celsius and a pressure range from −14 to 15 pounds per square inch (PSI), and gels or epoxies having similar characteristics may be suitable for use. A temperature or pressure outside of the corresponding ranges may cause the bond formed by the gel 42 to fail, thereby severing the attachment. However, other methods to secure known to those skilled in the art may be employed in the present design to ensure the bond does not sever when the sensor is operated outside the stated temperature and/or pressure range.

Figure 7:
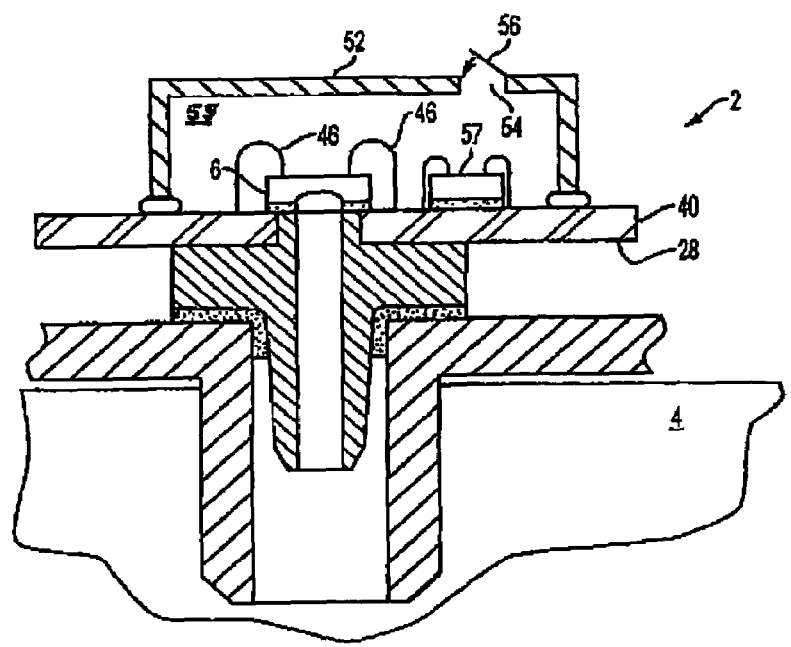
FIG. 7 is a cross-sectional view of the cover with a hole or adjustable opening.

In another unique aspect, a cap or covering 52 (hereinafter referred to as "cover 52") protects both the sensing die 6 and the associated circuitry as illustrated in FIGS. 1, 2 and 7. Cover 52 is hermetically-sealed to the ceramic board 28 ensuring an even greater protection. A hermetic seal 53 may be formed between cover 52 and ceramic board 28 by methods known to those skilled in the art. The cover 52 also creates a volume 55 defined by ceramic board 28 and cover 52. A fluid, such as a liquid or gas (e.g., air), is contained in the defined volume 55.

By protecting the sense die 6 and associated circuitry in the foregoing manner, the pressure of the fluid, gas, etc, acts on the first side 10 and the second side 8 of the sense die 6. This contrasts with conventional arrangements in which pressure is sensed from a second side, and the medium to which a first side of the sense die mounts serves as a reference point, which remains constant. In other words, the first side completely mounts to a solid structure, thus, the only change in pressure is from fluid interacting with the second side 8. In the present arrangement, both sides 8, 10 of sensing die 6 are exposed to a fluid, i.e. the fluid from vessel 4 and the gas (e.g. air) surrounding the second side 8 of sensing die 6. Therefore, the measured pressure of the fluid contained by vessel 6 is relative to the pressure of gas surrounding the second side 8 of sensing die 6. The gas surrounding the second side 8 of sensing die 6 serves as a reference point. In most situations, this reference point would be one (1) atmosphere. However, changes in altitude and/or the pressure of the surrounding environment causes a change in the reference point, which may cause inaccurate pressure measurement of the fluid. By hermetically sealing the cover, the reference point does not change, i.e. pressure does not fluctuate. The sensing arrangement of the pressure transducer 2 can therefore be considered an "absolute device", as the reference point is fixed.

Additionally, the pressure transducer 2 may be configured to function as a gauged device instead of an absolute device. Referring to FIG. 7, by placing an aperture 54 and an adjustable opening 56, i.e., a value 56, in cover 52, the atmosphere surrounding sensing die 6 is allowed to fluctuate (when the adjustable opening 56 is open) according to the pressures acting externally on pressure transducer 2. The adjustable opening 56 is designed to be a complete seal when closed, allowing the pressure transducer 2 to be switched between an absolute device and a gauged device. The adjustable opening 52 may be an adjustable valve, which is commonly known to those skilled in the art.

Figure 8:
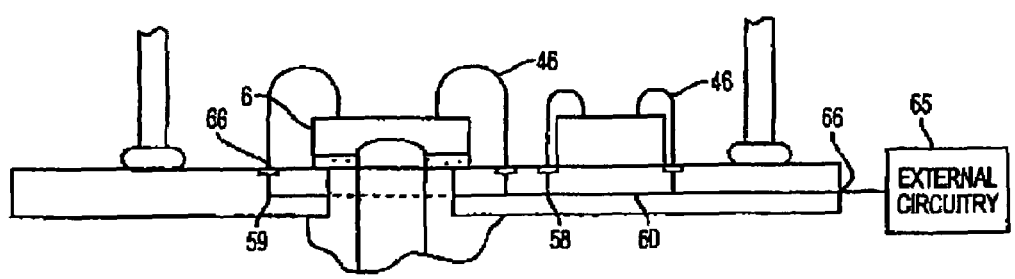
FIG. 8 is a cross-sectional view of the ceramic board illustrating the conduction paths.
Figure 9:
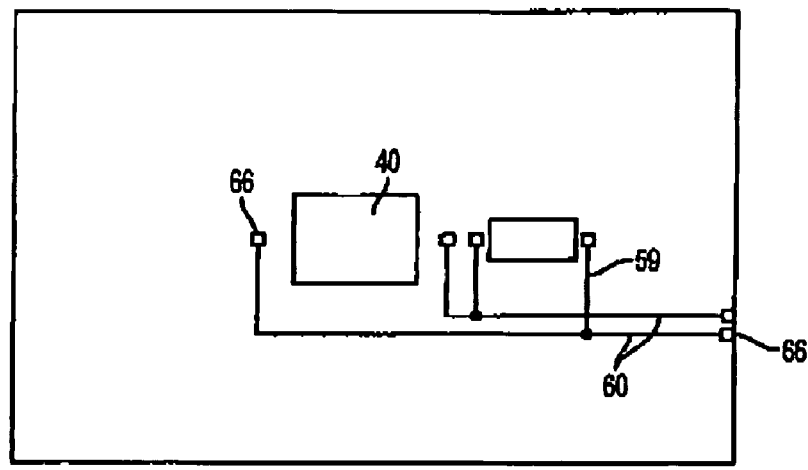
FIG. 9 is a surface view of the ceramic board illustrating the conduction paths.
Figure 10:
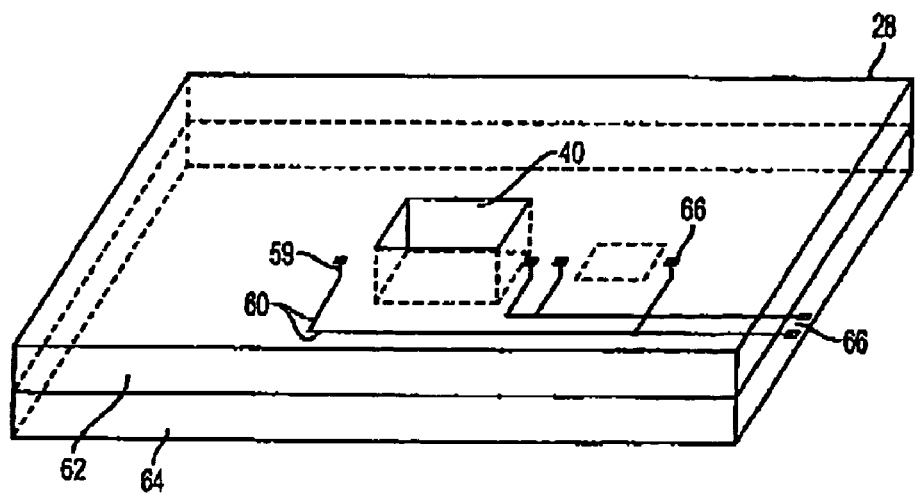
FIG. 10 is an oblique view of the ceramic board illustrating the conduction paths.
Figure 11:
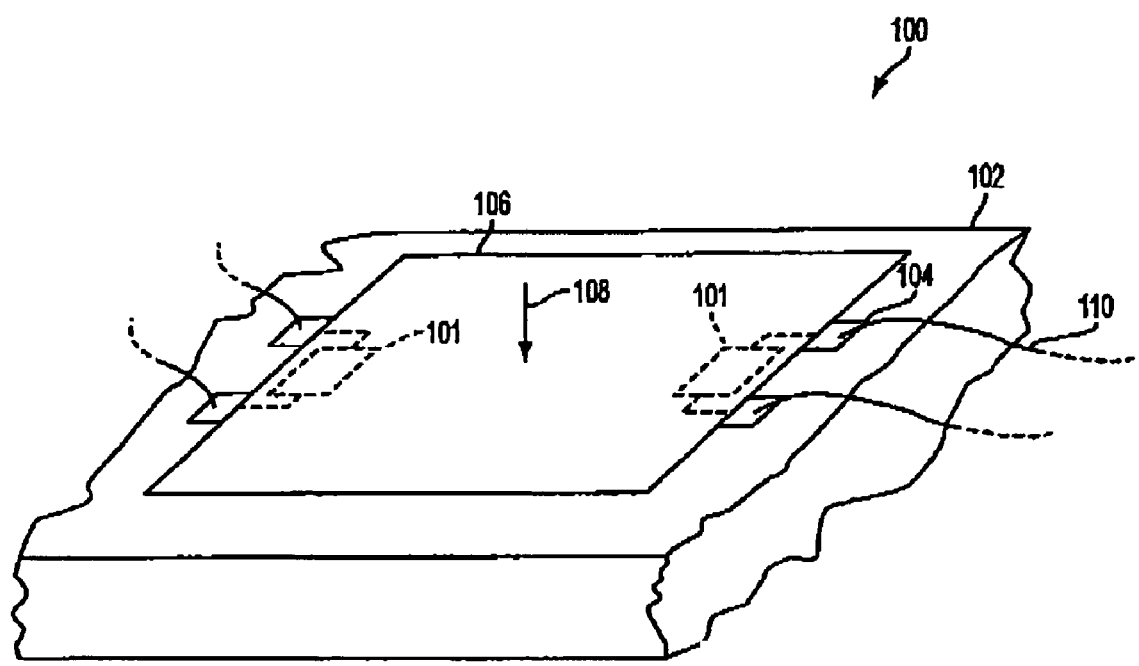
FIG. 11 is a conventional piezoresistive sensing die.

As illustrated in FIGS. 1, 2 and 7, an ASIC 57 and connecting wiring 46 are also contained by cover 52. In order to ensure a hermetic seal between cover 52 and the ceramic board 28, electrical connections to sensing die 6 and ASIC 57 do not penetrate cover 52. Ceramic board 28 contains electrical conduction paths 58, illustrated in FIGS. 8–10, for connecting ASIC 57 to sensing die 6 and to peripheral devices 65. Specifically, wiring 46 connects between metal contacts 7 of sensing die 6 and contacts 66 formed on the ceramic board 28. The wiring 46 also connects between the ASIC 57 and contacts 66.

Conductive paths 58 represent signal bus transmission lines in the illustrated embodiment. The number of conductive paths 58 are for illustrative purposes only and may be increased or decreased depending on the required electrical circuitry and connections.

In order to form conductive paths 58 in ceramic board 28, ceramic board 28 is manufactured in multiple layers. Adverting to FIG. 10, a first layer 62 and a second layer 64 are bonded together to form the ceramic board 28. The first layer 62 is formed having first conduction paths 59 extending from one surface of the first layer to the other. A first end of the first conduction paths 59 each connect to a respective contact 66 for electrically connecting to sensing die 6 and ASIC 57. When the first and second layers 62, 64 are combined, the second end of the first conduction paths 59 connects to a respective end of the second conductive paths 60.

On the surface of the second layer 64, the second conductive paths 60 are formed. The second conductive paths 60 extend along the second layer 64 surface to the edge where they connect to contacts 66 for connecting peripheral devices 65 (illustrated by FIG. 8). Peripheral devices 65 may supply power, additional processing, etc.

As a result, when the first and second layers 62, 64 are combined, the first and second conductive paths 59, 60 connect at respective ends. Metal contacts 66 electrically connect to wiring 46 and to peripheral devices 65. The arrangement of the conductive paths 58 is not limited to that just described. The conductive paths 58 may be arranged, for example, in any manner to connect sensing die 6 to the ASIC 57 and to peripheral devices 65 without penetrating the cover 52.

Adverting back to FIG. 1, a conduit 32 connects to housing 12. The conduit contains the electrical connections for electrically connecting pressure transducer 2 to peripheral devices 65. As depicted, the electrical connection 34 penetrates housing 12 and connects to ceramic board 28. A seal 36 is provided where the electrical connection 34 penetrates housing 12. The electrical connection may supply power, transfers any required signals, etc.

A lid 40 is placed into groove 42, which is formed around the periphery of the housing 12. Gel 15 is also provided in this groove 42 to ensure a hermetic seal. In operation as a gauged device, an adjustable valve should be provided in the lid 40 in order to switch between an absolute and a gauged operation.

In this design, multiple carriers 20 with sensing dies 6 and associated electronics may be placed in the housing 12 utilizing the same construction described above. This disclosure is not limited to one sensing die configuration, but may include multiple configurations.

As presented above, mounting the sensing die 6 using a gel 42 reduces the required manufacturing steps and reduces cost as compared to mounting the sensing die 6 with a conventional glass. Further, sensing the pressure of fluid contained by vessel 4 from the first side 8 of sensing die 6 isolates the wiring 46, resistors and metal contacts 7, and the associated circuitry from contact with the fluid. A cover 52 hermetically-sealed to ceramic board 28 to even further isolate sensing die 6 and ASIC 57 circuitry from contact with fluids and ensures a fixed reference point for sensing pressure. The pressure transducer may operate in an absolute state or a gauged state with incorporation of an adjustable opening 56 in cover 52 and lid 40. Conductive paths 59, 60 contained by the ceramic board 28 ensure that the hermetic seal 53 is not sacrificed and provides additional protection to the electrical connections. Housing 12 and lid 40 further isolate the pressure transducer 2 from the influence or effect of external environmental factors. As a result, the described pressure transducer arrangement has a significantly longer useful life.

Although the present invention has been described and illustrated in detail, it is to be clearly understood that the same is by way of illustration and example only and is not to be taken by way of limitation, the scope of the present invention being limited only by the terms of the appended claims.

What is claimed is:
1. A pressure transducer, comprising:
 a carrier having a central aperture for receiving fluid from a vessel;

a sense die mounted on the carrier, the sense die having a first side positioned to interact with the fluid received from the vessel;

pressure-sensing circuitry formed on a second side of the sense die note exposed to the fluid;

a ceramic board mounted on the carrier, the ceramic board bearing conductive paths electrically connecting the pressure-sensing circuitry to external circuitry; and at least a first and a second layer, wherein the first layer includes at least a first conductive path electrically connected to at least the pressure-sensing circuitry, and the second layer includes at least a second conductive path in contact with the first conductive path.

2. The pressure transducer of claim 1, wherein the first and second conductive paths are formed within the ceramic board and have a first set of contacts for electrically connecting to the pressure-sensing circuitry and a second set of contacts for electrically connecting to the external circuitry.

3. The pressure transducer of claim 2, wherein the second conducive path electrically connects to the external circuitry.

4. The pressure transducer of claim 2, wherein the first conductive path electrically connects to the external circuitry.

5. The pressure transducer of claim 2, wherein the first conductive path passes from one side of the first layer to an opposite side, and the second conductive path is formed along a surface of the second layer.

6. The pressure transducer of claim 5, wherein the first layer is secured to the second layer, the second conductive path being contained between the first layer and the second layer.

7. The pressure transducer of claim 1, further comprising:

a non-metal cover positioned to prevent the fluid or other external elements from contacting the second side of the sense die, and hermetically-sealed.

8. The pressure transducer of claim 1, wherein the carrier is mounted within a housing positioned and configured to confine fluid entering the housing to the central aperture.

9. The pressure transducer of claim 8 further comprising:

a lid hermetically-sealed to an access opening to the containment area of the housing.

* * * * *